US009590092B2

(12) United States Patent
Seok

(10) Patent No.: US 9,590,092 B2
(45) Date of Patent: Mar. 7, 2017

(54) SUPER JUNCTION FIELD EFFECT TRANSISTOR WITH INTERNAL FLOATING RING

(71) Applicant: IXYS Corporation, Milpitas, CA (US)

(72) Inventor: Kyoung Wook Seok, Milpitas, CA (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 14/540,934

(22) Filed: Nov. 13, 2014

(65) Prior Publication Data

US 2016/0141408 A1 May 19, 2016

(51) Int. Cl.
*H01L 29/78* (2006.01)
*H01L 29/06* (2006.01)
*H01L 29/66* (2006.01)
*H01L 29/40* (2006.01)

(52) U.S. Cl.
CPC ...... *H01L 29/7811* (2013.01); *H01L 29/0619* (2013.01); *H01L 29/0634* (2013.01); *H01L 29/0692* (2013.01); *H01L 29/66712* (2013.01); *H01L 29/402* (2013.01)

(58) Field of Classification Search
CPC ............. H01L 29/0634; H01L 29/0878; H01L 29/0619; H01L 29/4236; H01L 29/7811; H01L 29/0692
See application file for complete search history.

(56) References Cited

U.S. PATENT DOCUMENTS

| 6,982,459 | B2 * | 1/2006 | Suzuki | H01L 29/0634 257/329 |
|---|---|---|---|---|
| 8,217,454 | B2 * | 7/2012 | Lin | H01L 29/0634 257/342 |
| 9,082,845 | B1 * | 7/2015 | Seok | H01L 29/7811 |
| 9,219,142 | B2 * | 12/2015 | Saito | H01L 29/4236 |
| 2005/0184336 | A1 * | 8/2005 | Takahashi | H01L 29/0634 257/328 |
| 2009/0057757 | A1 * | 3/2009 | Hokomoto | H01L 29/0619 257/330 |
| 2012/0112306 | A1 * | 5/2012 | Onishi | H01L 29/0634 257/487 |

(Continued)

*Primary Examiner* — Kenneth Parker
*Assistant Examiner* — Fang-Xing Jiang
(74) *Attorney, Agent, or Firm* — Imperium Patent Works; Amir V. Adibi

(57) ABSTRACT

A Super Junction Field Effect Transistor (FET) device includes a charge compensation region disposed on a substrate of semiconductor material. The charge compensation region includes a set of strip-shaped P− type columns, a floating ring-shaped P− type column that surrounds the set of strip-shaped P− type columns, and a set of ring-shaped P− type columns that surrounds the floating ring-shaped P− type column. A source metal is disposed above portions of the charge compensation region. The source metal contacts each of the strip-shaped P− type columns and each of the ring-shaped P− type columns. An oxide is disposed between the floating P− type column and the source metal such that the floating P− type column is electrically isolated from the source metal. The device exhibits a breakdown voltage that is 0.2% greater than if the floating P− type column were to contact the source metal.

12 Claims, 13 Drawing Sheets

SUPER JUNCTION FIELD EFFECT TRANSISTOR STRUCTURE
(PERSPECTIVE VIEW)

(56) References Cited

U.S. PATENT DOCUMENTS

2012/0273884 A1\* 11/2012 Yedinak .............. H01L 29/0878
                                                  257/341
2014/0197476 A1\*  7/2014 Shimatou ............ H01L 29/0619
                                                  257/329

\* cited by examiner

SUPER JUNCTION FIELD EFFECT TRANSISTOR STRUCTURE
(TOP-DOWN VIEW)

P- TYPE COLUMNS OF THE SUPER JUNCTION
FET DIE STRUCTURE
(TOP-DOWN VIEW)

ENLARGED CROSS SECTION A-A OF FIG. 2

GATE POLY LAYERS OF THE SUPER
JUNCTION FET DIE STRUCTURE
(TOP-DOWN VIEW)

SUPER JUNCTION FIELD EFFECT TRANSISTOR STRUCTURE
(PERSPECTIVE VIEW)

DOPING CONCENTRATION OF CHARGE COMPENSATION REGION

ELECTRON CURRENT DENSITY

SUPER JUNCTION FIELD EFFECT TRANSISTOR DEVICE
WITHOUT FLOATING INTERNAL RING
(TOP-DOWN VIEW)

ENLARGED CROSS SECTION C-C OF FIG. 12

SUPER JUNCTION FIELD EFFECT TRANSISTOR WITH INTERNAL FLOATING RING

TECHNICAL FIELD

The described embodiments relate generally to Super Junction field effect transistors and techniques for making rugged Super Junction field effect transistors.

BACKGROUND INFORMATION

Super junction techniques are often employed to fabricate an N-channel field effect transistor device. Such an N-channel field effect transistor device can be made whose drift region includes what is called a "charge compensation region". The N-channel field effect transistor device is typically made to meet a particular breakdown voltage requirement. During fabrication, if the concentration of N-type dopants within the charge compensation region becomes undesirably imbalanced with respect to the concentration of P-type dopants within the charge compensation region, then the breakdown voltage requirement will not be satisfied. To maintain charge balance between the concentration of P-type dopants and N-type dopants, very tight process control is required. Fabricating the N-channel field effect transistor device to meet a particular breakdown voltage requirement requires tight process control because process variation can result in charge imbalance between the concentration of P-type dopants and N-type dopants. Usually, such charge imbalance caused by process variations occurs at the corners and edges of an active area of the device causing the formation of local low voltage areas and in a weak device. In addition, conventional super junction fabrication processes are undesirably expensive because forming P− type columns involves many delicate process steps. A solution that overcomes these shortcomings is desired.

SUMMARY

A Super Junction Field Effect Transistor (FET) device includes a charge compensation region disposed on a substrate of monocrystalline semiconductor material. The charge compensation region includes a first plurality of columns of P− type epitaxial semiconductor material within a region of N− type epitaxial semiconductor material, a floating ring-shaped column of P− type epitaxial semiconductor material within the region of N− type epitaxial semiconductor material, and a second plurality of columns of P− type epitaxial semiconductor material within the region of N− type epitaxial semiconductor material. The P− type columns may, for example, be strip-shaped columns extending parallel to one another or ring-shaped columns organized concentrically with respect to one another. The alternating P− type and N− type semiconductor material forms the charge compensation region. After the Super Junction FET device die has been manufactured, it is typically packaged into a package such as a standard TO-220 or TO-247 package so that the packaged device can then be soldered to a printed circuit board or otherwise used by an end user.

In accordance with one novel aspect, no portion of the floating ring-shaped P− type column contacts a source metal terminal of the Super Junction FET device. An oxide layer is disposed above an upper surface of the floating ring-shaped P− type column. The oxide layer is disposed between the upper surface of the floating ring-shaped P− type column and the source metal terminal of the Super Junction FET device. Accordingly, the floating ring-shaped P− type column is not electrically coupled to the source metal terminal and the floating ring-shaped P− type column is electrically isolated from the source metal terminal. In addition to electrically isolating the floating ring-shaped P− type column from the source metal, the floating ring-shaped P− type column is maintained a desired distance from adjacent P− type columns. A first edge of the floating ring-shaped P− type column is maintained a distance D0 from an edge of an adjacent inner P− type column and a second edge of the floating ring-shaped P− type column is maintained a distance D1 from an edge of an adjacent outer P− type column. In one example, distance D0 is one-half of the distance D1. In another example, distance D0 is within a range having a lower bound that is one-fourth of the distance D1 and having an upper bound that is the distance D1.

During blocking mode operation, the upper surface of the floating ring-shaped P− type column will exhibit a positive voltage greater than zero. This is due in part to capacitive coupling effects between the floating ring-shaped P− type column and the adjacent P− type columns. The other P− type columns that contact the source metal terminal, on the other hand, will exhibit a zero voltage along their upper surfaces. As such, a voltage difference between the upper surface of the floating ring-shaped P− type column and the drain metal terminal will be less than a voltage difference between the upper surfaces of the other P− type columns that contact the source metal terminal and the drain metal terminal. Therefore, the electric field is lower along the floating ring-shaped P− type column than the electric field along the other P− type columns that are electrically coupled to the source metal terminal. Because the electric field is lower along the floating ring-shaped P− type column, no region adjacent to or near the floating ring-shaped P− type column will exhibit maximum impact ionization during avalanche breakdown of the device. Instead, regions adjacent to the inner P− type columns will exhibit maximum electron current density during operation. Accordingly, the floating ring-shaped P− type column increases the avalanche breakdown voltage of the device by at least 0.2% than if the floating ring-shaped P− type column were to be electrically coupled to the source metal terminal.

Forming the floating ring-shaped P− type column makes the device less susceptible to process variations during fabrication. Such process variations may cause a charge imbalance along edges and corners along the P− type columns of the internal active area. The effects on the breakdown voltage along the edges and corners along the P− type columns of the internal active area are mitigated by the floating ring-shaped P− type column. No maximum avalanche breakdown current density occurs nearby the regions adjacent to the floating ring-shaped P− type column. Consequently, forming the floating ring-shaped P− type column yields a more rugged device than if no floating ring-shaped P− type column is employed.

In one example, the charge compensation region includes a set of strip-shaped columns of P− type epitaxial semiconductor material within a region of N− type epitaxial semiconductor material, a floating ring-shaped column of P− type epitaxial semiconductor material within the region of N− type epitaxial semiconductor material, and a set of ring-shaped columns of P− type epitaxial semiconductor material within the region of N− type epitaxial semiconductor material. Each of the strip-shaped P− type columns extend parallel to one another and extend parallel to an edge of the die. The ring-shaped P-type columns are concentrically disposed with respect to each other when the die is viewed from a top-down perspective. Each of the P– type columns includes a body portion at an upper portion of the column that extends downwards towards a substrate of the die. The die has an active area comprising an internal active area and an external active area. The internal active area includes the set of strip-shaped P– type columns. The external active area includes the floating ring-shaped P– type column and the set of ring-shaped P-type columns. The floating ring-shaped P– type column is disposed between the outer set of ring-shaped P-type columns and the inner set of strip-shaped P– type columns. The floating ring-shaped P– type column is disposed along a periphery of the set of strip-shaped P– type columns. The source metal terminal of the device contacts each of the inner set of strip-shaped P– type columns and the source metal terminal also contacts each of outer set of ring-shaped P-type columns. An oxide is disposed between an upper surface of the floating ring-shaped P– type column and the source metal terminal. No portion of the floating ring-shaped P– type column contacts the source metal terminal. The floating ring-shaped P– type column is electrically isolated from the source metal terminal.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In the text and drawings, the dopant labels N++, N+, N–, N, P+, P–, and P are only very loose general descriptions of relative dopant concentrations. A particular dopant label appearing in the text below has meaning within the local context of its usage. In the text and drawings, the term P type is sometimes used not as a description of a relative dopant concentration, but rather is used as a broad term to denote semiconductor material that may be P– type, or may be P type, or may be P+ type, or that may include sub-regions of various P type dopant concentrations.

Figure 1:
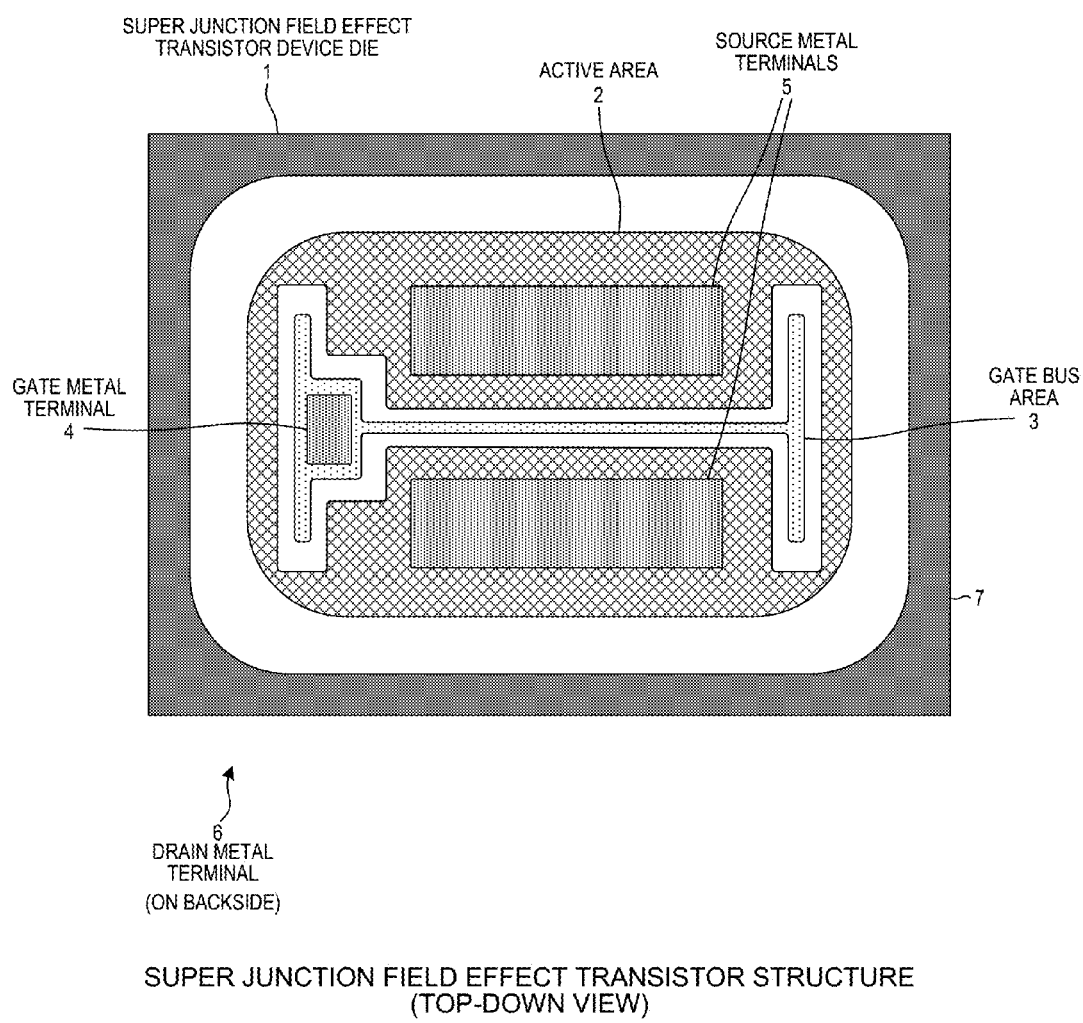
FIG. 1 is a top-down diagram of a Super Junction Field Effect Transistor (FET) device die 1 in accordance with one novel aspect.

FIG. 1 is a top-down diagram of a Super Junction Field Effect Transistor (FET) device die 1 in accordance with one novel aspect. Such a Super Junction FET device die 1 is also loosely referred to as a Super Junction Metal Oxide Semiconductor Field Effect Transistor (MOSFET). As viewed from the top-down perspective of FIG. 1, the Super Junction FET device die 1 has an active area 2. The active area 2 surrounds a gate bus area 3. A gate metal terminal 4 and source metal terminals 5 serve as bond pads. Reference numeral 7 identifies a periphery of the die 1. The entire backside of the die 1 is a layer of metal that forms the drain metal terminal 6. Once the die 1 has been manufactured, it is typically packaged into a package such as a standard TO-220 or TO-247 package so that the packaged device can then be soldered to a printed circuit board or otherwise used by an end user.

Figure 2:
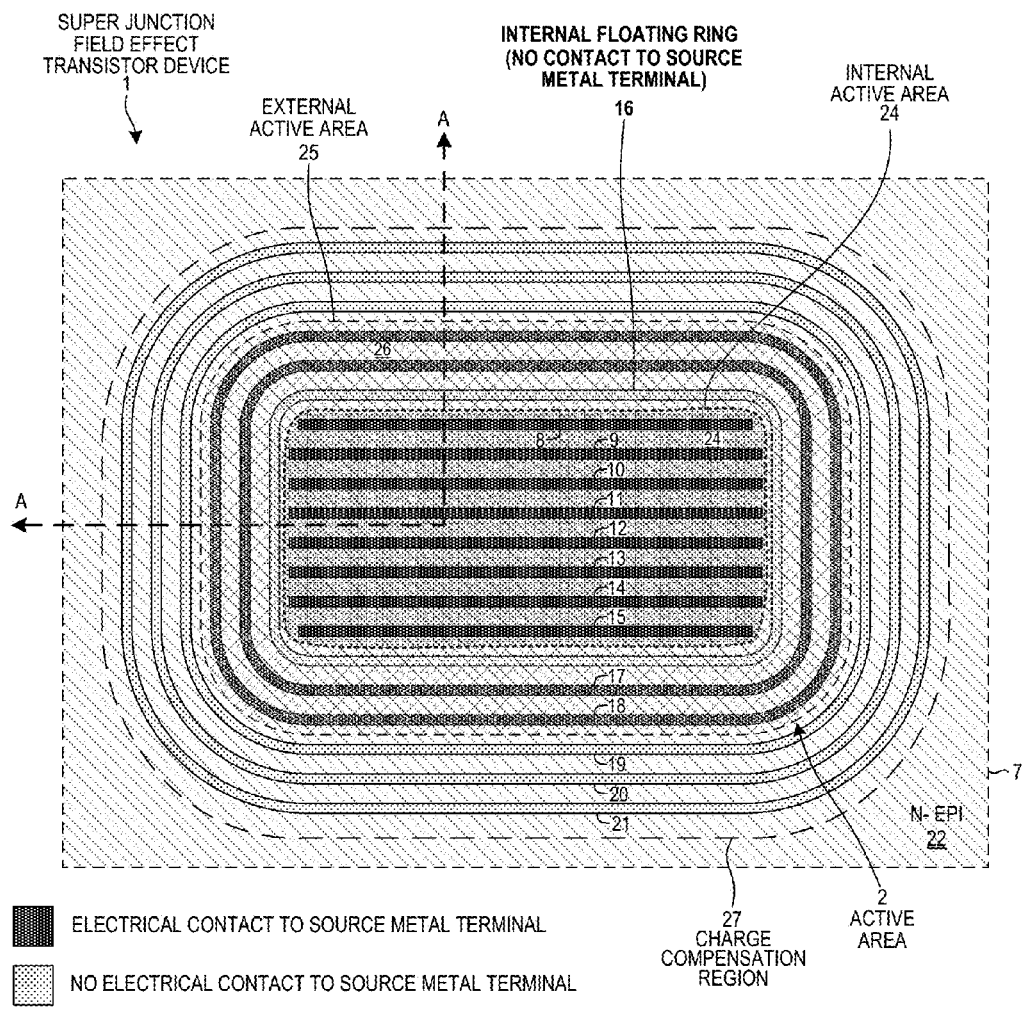
FIG. 2 is a top-down diagram of P– type columns 8-21 of the Super Junction FET device die 1.

FIG. 2 is a top-down diagram of P– type columns 8-21 of the Super Junction FET device die 1. The P– type columns 8-21 may also be referred to as P– type pillars. The P– type columns 8-21 are formed by performing a deep trench etch downward through an N– type layer 22 of epitaxial silicon grown on a semiconductor substrate (not shown). The deep trenches are of a size and spacing as is known in the art to make a charge compensation region with an edge termination region that is suitable for a power Super Junction FET. Next, the deep trenches are filled with epitaxially grown P– type silicon. The resulting structure involves a set of strip-shaped P– type columns 8-15 and a set of ring-shaped P– type columns 16-21. The strip-shaped P-type columns 8-15 all extend parallel to one another. The ring-shaped P-type column structures 16-21 are concentrically disposed with respect to each other when the die 1 is viewed from the top-down perspective of FIG. 2. Each of the P– type columns 8-21 includes a body portion at an upper portion of the column that is not shown in FIG. 2.

The active area 2 of the die 1 comprises an internal active area 24 and an external active area 25. The internal active area 24 includes the set of strip-shaped P– type columns 8-15. Each of the set of strip-shaped P– type columns 8-15 extend parallel to an edge of the die 1. The strip-shaped P– type columns 9-14 extend an equivalent length. The upper strip-shaped P– type column 8 and the lower strip-shaped P– type column 15 extend an equivalent length that is shorter than the length of the other strip-shaped P– type columns 9-14. The internal active area 24 is surrounded by an external active area 25. The external active area 25 includes the ring-shaped P-type column structures 16, 17, and 18. Reference numeral 27 identifies a charge compensation region that is disposed on a substrate of monocrystalline semiconductor material (see FIG. 5). The charge compensation region 27 includes the set of strip-shaped P– type columns 8-15 and the set of ring-shaped P– type columns 16-21 within the region of N– type epitaxial semiconductor material 22. The alternating P– type and N– type semiconductor material makes the charge compensation region 27.

In accordance with one novel aspect, an upper portion of the ring-shaped P– type column 16 does not contact a source metal terminal (not shown, see FIG. 7) of the die 1. The set of strip-shaped P– type columns 8-15 and the ring-shaped P– type columns 17 and 18, on the other hand, have a body portion (not shown, see FIG. 7) that contacts the source metal of the die 1. The darker stippling indicates that an upper portion of the P– type column contacts the source metal, whereas a lighter stipling indicates that no portion of the P– type column contacts the source metal. Because the ring-shaped P– type column 16 does not contact the source metal of the die 1, the ring-shaped P– type column 16 is also referred to as a "floating ring" or an "internal floating ring". The internal floating P– type ring 16 maintains a charge balance between the N– type and P– type regions at corners and edges of the strip-shaped P– type columns 8-15 as explained in further detail with regard to FIG. 3. If the charge balance between the N-type and P-type regions is not maintained at the corners and edges of the strip-shaped P– type columns 8-15, then the breakdown voltage will not be consistent across the internal active area 2.

Figure 3:
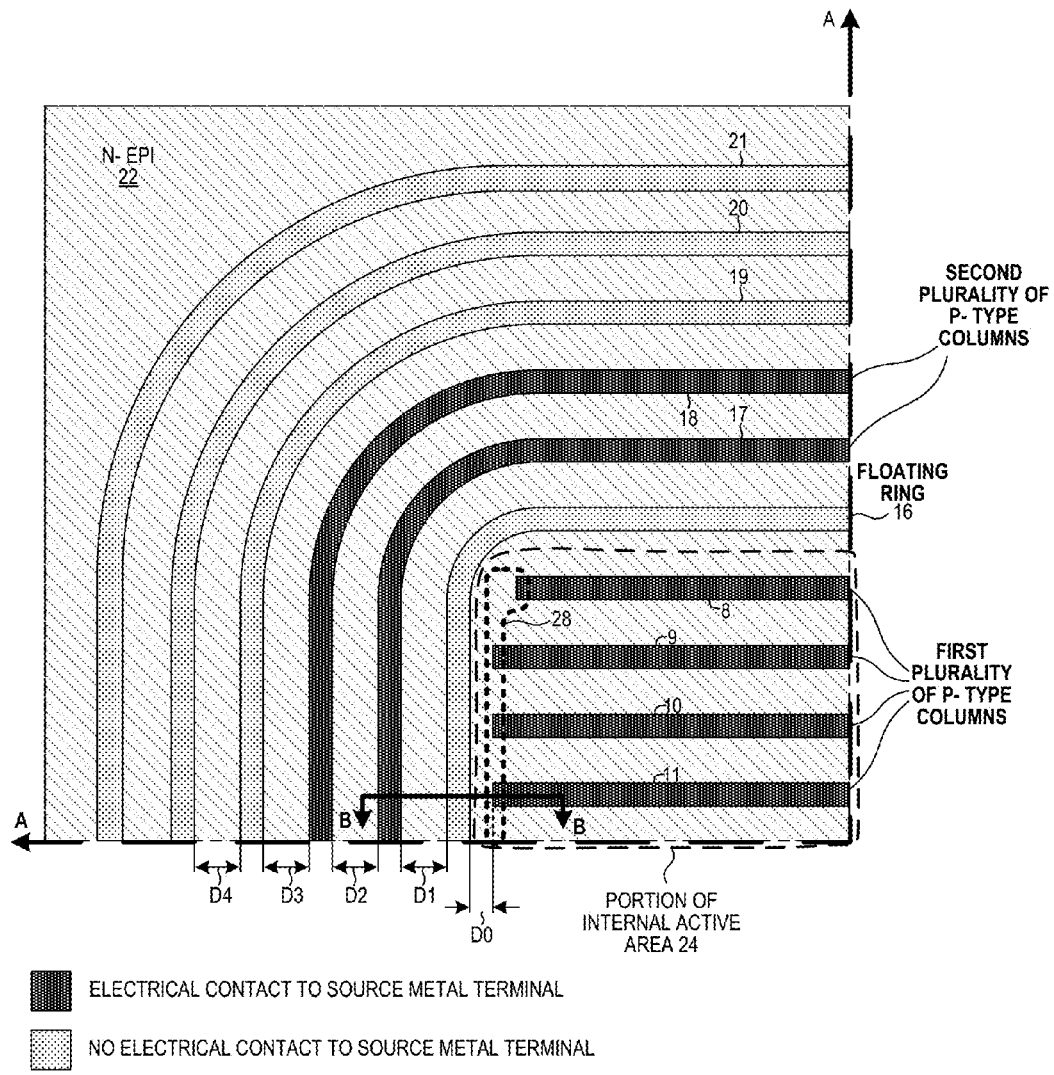
FIG. 3 is a diagram of an enlarged cross section A-A of the top-down diagram of P– type columns 8-21 of FIG. 2.

FIG. 3 is a diagram of an enlarged cross section A-A of the top-down diagram of P– type columns 8-21 of FIG. 2. Reference numeral 28 identifies a portion of corners and edges of the internal active area where charge imbalances between the N-type and P-type regions are most susceptible to process variations during fabrication. The ring-shaped P– type columns 19, 20, and 21 form a junction termination region of the die 1. The P– type columns 19, 20, and 21 do not contact the source metal terminal of the die 1. The internal floating P-type ring 16 is spaced a distance D1 from the ring-shaped P– type column 17. The ring-shaped P– type column 17 is spaced a distance D2 from the ring-shaped P– type column 18. The ring-shaped P– type column 18 is spaced a distance D3 from the ring-shaped P– type column 19. The ring-shaped P– type column 19 is spaced a distance D4 from the ring-shaped P– type column 20. The distances D1, D2, D3, and D4 are substantially equivalent. The distances D1, D2, D3, and D4 and the concentrations of the N– type regions and the P– type regions are selected so as to provide consistent charge balance across the die 1 as further explained in connection with FIG. 5.

Figure 4:
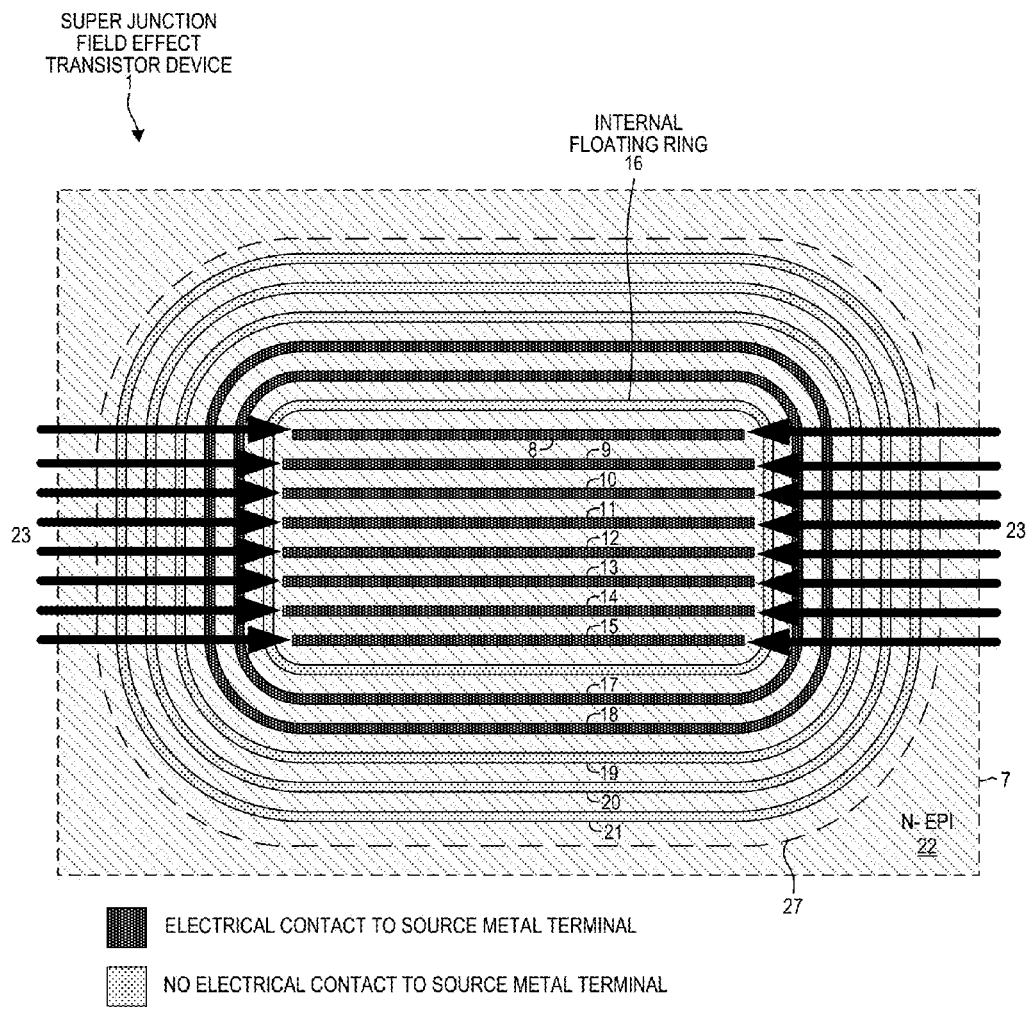
FIG. 4 is a top-down diagram of P– type columns 8-21 of the Super Junction FET device die 1 identifying corners and edges of the active area 2.

FIG. 4 is a top-down diagram of P– type columns 8-21 of the Super Junction FET device die 1 identifying corners and edges of the active area 2. Bold lines and arrows 23 identify corners and edges of the strip-shaped P– type columns 8-15. Charge imbalance due to process variations during fabrication of the die 1 are most likely to occur along corners and edges 23. The process variations that result in charge imbalance typically involve tapering angle of trench etching, N– epi concentration, and P– type column concentration. Internal floating ring 16 minimizes the effects on breakdown voltage of any such charge imbalance that may result during fabrication.

Figure 5:
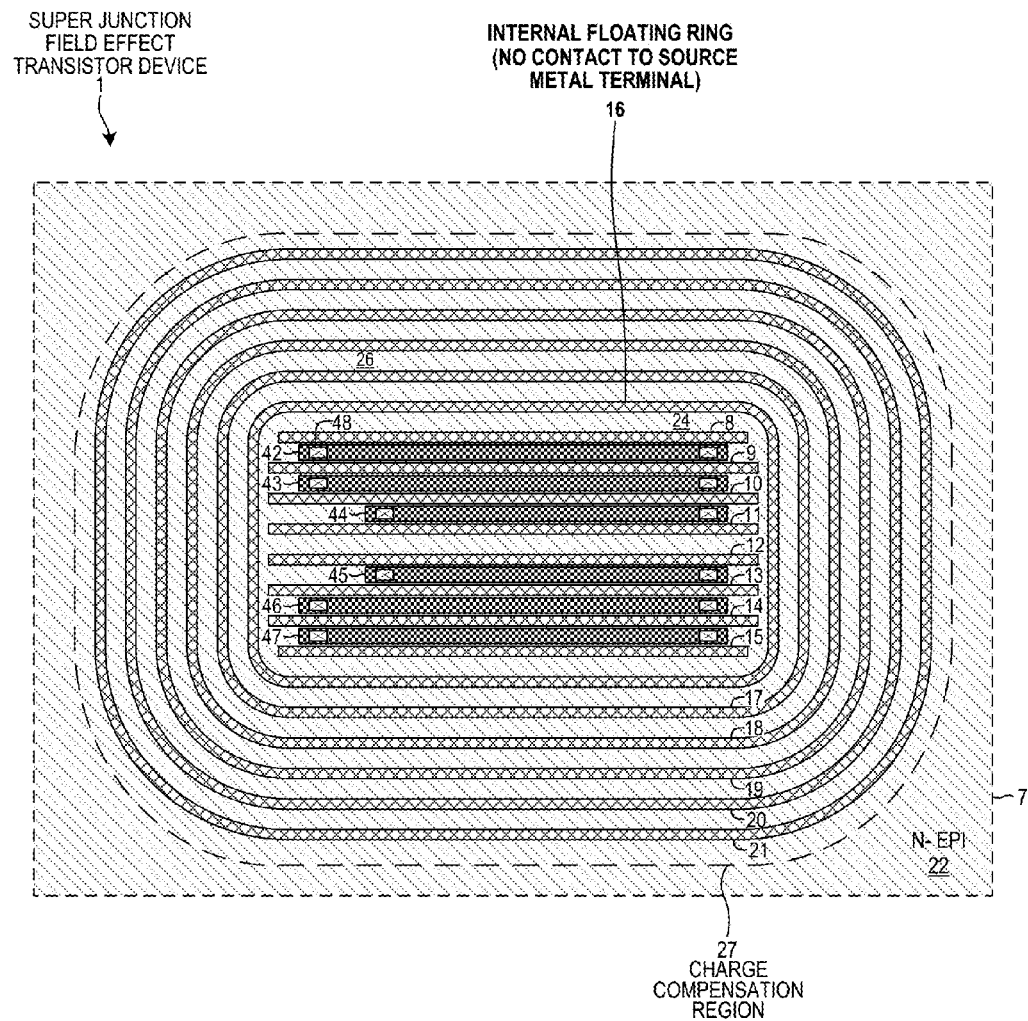
FIG. 5 is a diagram of gate poly layers 42-47 of the die 1.

FIG. 5 is a diagram of gate poly layers 42-47 of the die 1. Each of gate poly layers 42-47 is a strip that extends parallel to an edge of die 1. The gate poly layers 42-47 are disposed between the P– type columns 8-15 within the internal active area of the die 1. Each of the gate poly layers 42-47 has a contact window at each edge of the gate poly layer. Reference numeral 48 identifies one such contact window. Gate metal terminal 4 (see FIG. 1) contacts gate poly layers 42-47 via the contact windows. No gate poly is disposed between strip-shaped P– type columns 11 and 12 because the gate bus area 3 (see FIG. 1) extends through the area between P– type columns 11 and 12. Gate poly layers 44 and 45 are slightly shorter than the other gate poly layers to provide an area for the gate metal terminal 4 (see FIG. 1).

Figure 6:
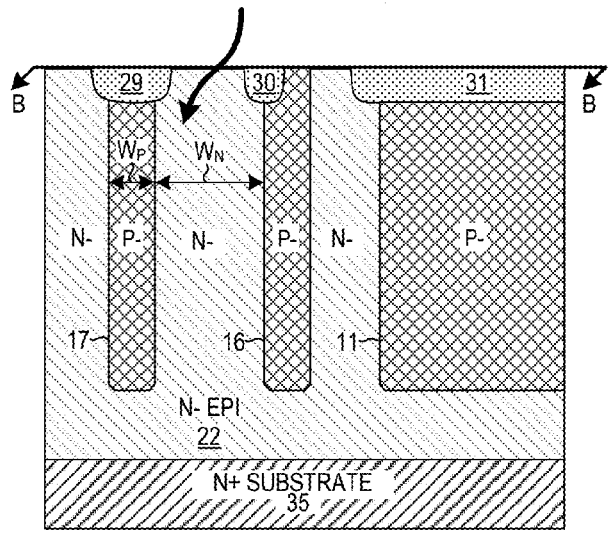
FIG. 6 is a diagram of a cross section B-B of the die 1 showing a portion of the strip-shaped P– type column 11, a portion of the internal floating P– type column 16, and a portion of the ring-shaped P– type column 17.

FIG. 6 is a diagram of a cross section B-B of the die 1 showing a portion of the strip-shaped P– type column 11, a portion of the internal floating P– type column 16, and a portion of the ring-shaped P– type column 17. $W_N$ represents a width of the N– type region, $N_N$ represents an N-type dopant concentration of the N– region, $W_P$ represents a width of the P– type region, and $N_P$ represents a P-type dopant concentration of the P– region. To achieve a high breakdown voltage, a charge balance having the following relationship is desired: $W_N N_N \approx W_P N_P$. If there is a charge imbalance due to a doping difference between the N– type pillars and the P– type pillars, then the electric field profile is disturbed and the breakdown voltage of the device is not consistent across the active area of the die 1. Such charge imbalance is most likely to occur along the edge and corners of the strip-shaped P– type columns 8-15 identified in FIG. 4. In another example, a charge balance is desired such that $W_P N_P$ is ten percent (10%) greater than $W_N N_N$.

Figure 7:
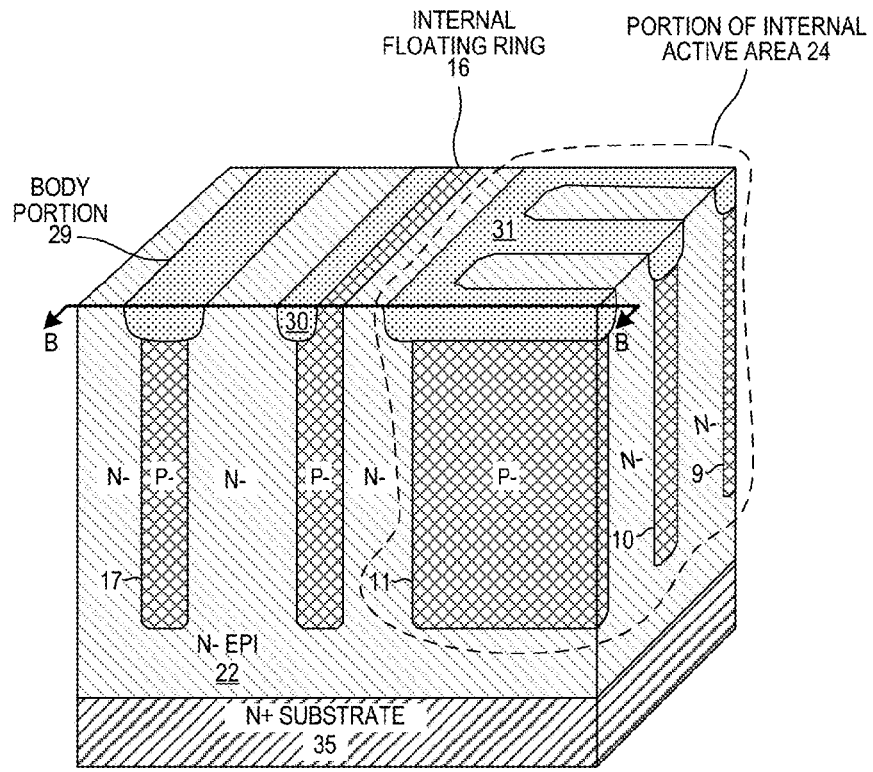
FIG. 7 is a perspective diagram of the cross section B-B of the Super Junction FET device die 1.

FIG. 7 is a perspective diagram of the cross section B-B of the Super Junction FET device die 1. Each of the P– type columns of die 1 includes a P– type body portion that extends from an upper portion of the column towards a substrate 35. Reference numerals 29, 30, and 31 identify P– type body portions. In one example, the semiconductor substrate 35 is N+ type monocrystalline bulk silicon material. In another example, the substrate 35 can include multiple layers. Internal floating P– type column 16 includes a single-sided P– type body portion 30 rather than a double-sided P– type body portion such as body portion 29. By employing a single-sided P– type body portion 30, the P– type column 16 exhibits less electrical coupling with edges of strip-shaped P– type columns 8-15 of internal active area 24 than if P– type column 16 employed a double-sided P– type body portion.

Figure 8:
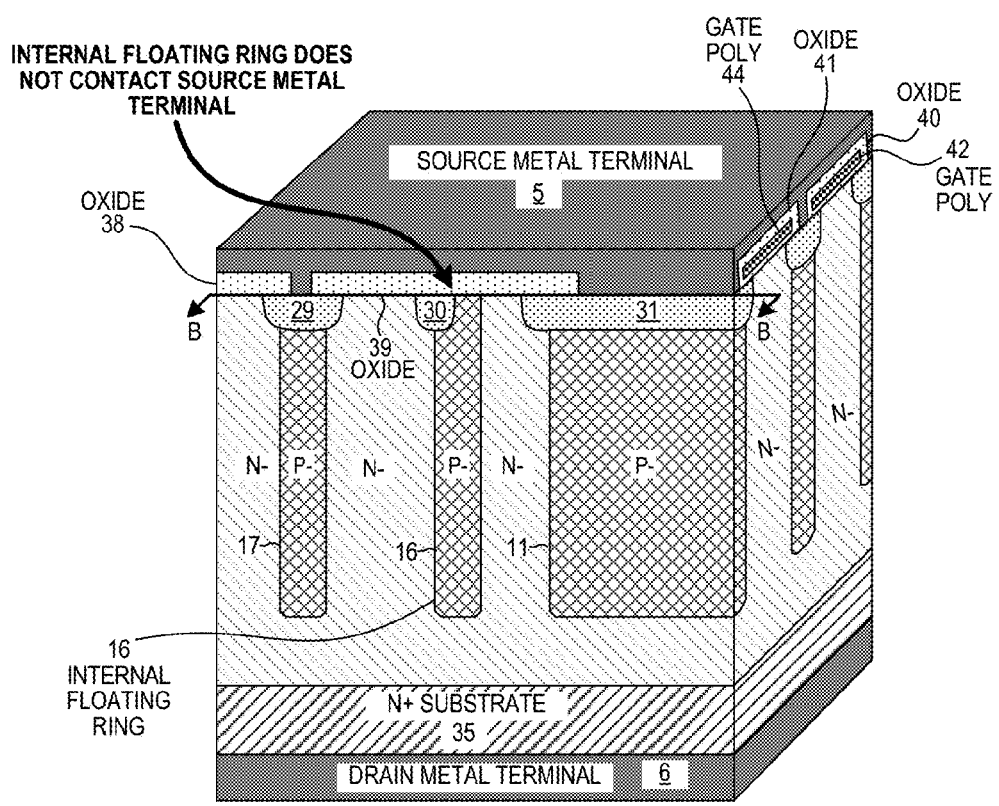
FIG. 8 is a diagram of the cross-section B-B of the Super Junction FET device die 1 after the source metal terminal 5 and the drain metal terminal 6 of the die 1 have been formed.

FIG. 8 is a diagram of the cross-section B-B of the Super Junction FET device die 1 after the source metal terminal 5 and the drain metal terminal 6 of the die 1 have been formed. The drain metal terminal 6 is disposed on a bottom surface of the die 1. The source metal terminal 5 is disposed on an upper surface of the die 1. Reference numerals 38, 39, 40, and 41 identify the oxide layers. Reference numerals 42 and 43 identify the gate poly layers. After fabrication of the die 1, no portion of the internal floating ring 16 contacts the source metal terminal. The source metal terminal 5 contacts the body portion 29 of the P– type column 17, and the source metal terminal 5 contacts the body portion 31 of the P– type column 11.

Figure 9:
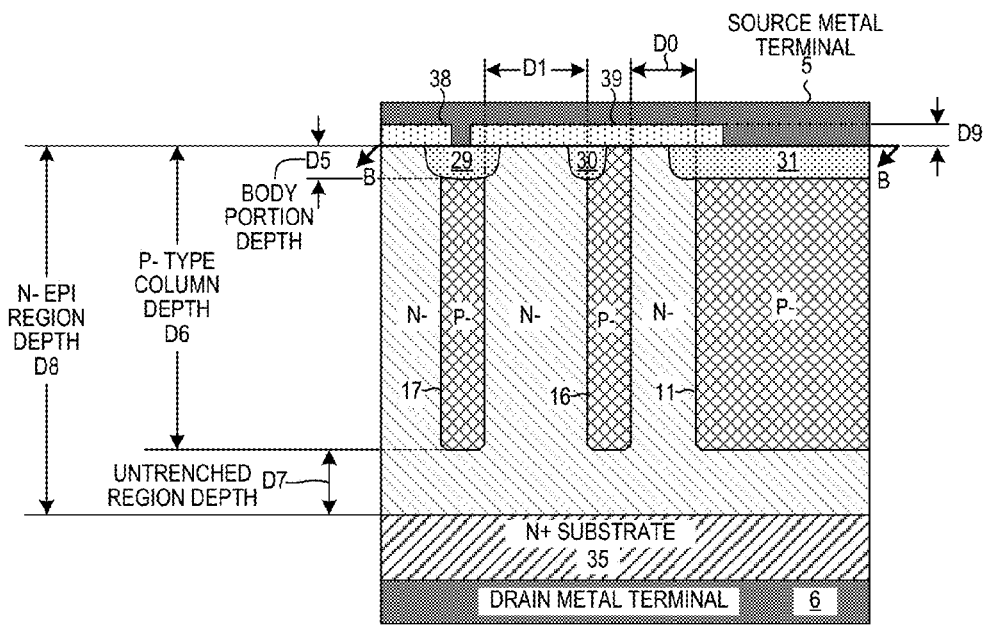
FIG. 9 is a diagram of the cross-section B-B of the Super Junction FET device die 1 showing dimensions of various aspects of the die 1.

FIG. 9 is a diagram of the cross-section B-B of the Super Junction FET device die 1 showing dimensions of various aspects of the die 1. Distance D0 identifies a distance that extends from an edge of strip-shaped P− type column 11 and an edge of internal floating P− type column 16. Distance D1 identifies a distance that extends from an edge of ring-shaped P− type column 17 and an opposite edge of internal floating P− type column 16. In this example, distance D0 is approximately three microns and distance D1 is approximately six microns. Distance D1 is twice the distance of D0. In another example, distance D0 is within a range having a lower bound that is one-fourth of the distance D1 and having an upper bound that is the distance D1.

Body portion depth D5 is a distance that extends from an upper surface of body portion 29 to a lower surface of the body portion 29. Each of the body portions 29, 30, and 31 extends the same distance D5 downwards from an upper surface of P− type pillars 17, 16, and 11, respectively. Distance D5 is between 0.8 microns and 4.0 microns. P− type column depth D6 is a distance that extends from an upper surface of P− type pillars 17 to a lower surface of P− type pillar 17. Each of P− type pillars 17, 16, and 11 extends the distance D6 from an upper surface of the charge compensation region down towards the N+ substrate 35. Distance D6 is within a range having a lower bound of four times the distance D5 and having an upper bound of thirty times the distance D5. Untrenched region depth D7 is a distance that extends from the lower surface of the P− type pillar 17 to the upper surface of the N+ substrate 35. Untrenched region depth D7 is the distance between the lower surface of the charge compensation region and the upper surface of the N+ substrate 35. Untrenched region depth D7 is between zero and distance D6. N− epi region depth D8 is a distance that extends from an upper surface of the charge compensation region to an upper surface of the N+ substrate 35.

In the example of FIG. 9 where the device 1 is to have an avalanche breakdown voltage of 700V, body portion depth D5 is approximately two microns, P− type column depth D6 is approximately thirty-five microns, untrenched region depth D7 is approximately fifteen microns, and N− epi region depth D8 is approximately fifty microns. P− type column depth D6 is more than seventeen times the body portion depth D5. Untrenched region depth D7 is more than seven times the body portion depth D5. P− type column depth D6 is more than two times untrenched region depth D7.

In another example where a Super Junction FET device is to have an avalanche breakdown voltage of 300V, body portion depth D5 is approximately one micron, P− type column depth D6 is approximately twenty microns, untrenched region depth D7 is approximately four microns, and N− epi region depth D8 is approximately twenty-four microns. P− type column depth D6 is twenty times the body portion depth D5. Untrenched region depth D7 is four times the body portion depth D5. P− type column depth D6 is five times untrenched region depth D7.

In yet another example where a Super Junction FET device is to have an avalanche breakdown voltage of 600V, body portion depth D5 is approximately two microns, P− type column depth D6 is approximately thirty-five microns, untrenched region depth D7 is approximately ten microns, and N− epi region depth D8 is approximately forty-five microns. P− type column depth D6 is more than seventeen times the body portion depth D5. Untrenched region depth D7 is five times the body portion depth D5. P− type column depth D6 is more than three times untrenched region depth D7.

In yet another example where a Super Junction FET device is to have an avalanche breakdown voltage of 900V, body portion depth D5 is approximately two microns, P− type column depth D6 is approximately thirty-five microns, untrenched region depth D7 is approximately thirty microns, and N− epi region depth D8 is approximately sixty-five microns. P− type column depth D6 is more than seventeen times the body portion depth D5. Untrenched region depth D7 is fifteen times the body portion depth D5.

Oxide layers 38 and 39 are formed by employing Plasma-enhanced Chemical Vapor Deposition (PECVD) techniques to deposit oxide layers 38 and 39 above the charge compensation region of the die. Distance D9 is a distance that extends from an upper surface of oxide 39 to a lower surface of oxide 39. In this example, distance D9 is one micron with a ten-percent deviation.

Figure 10:
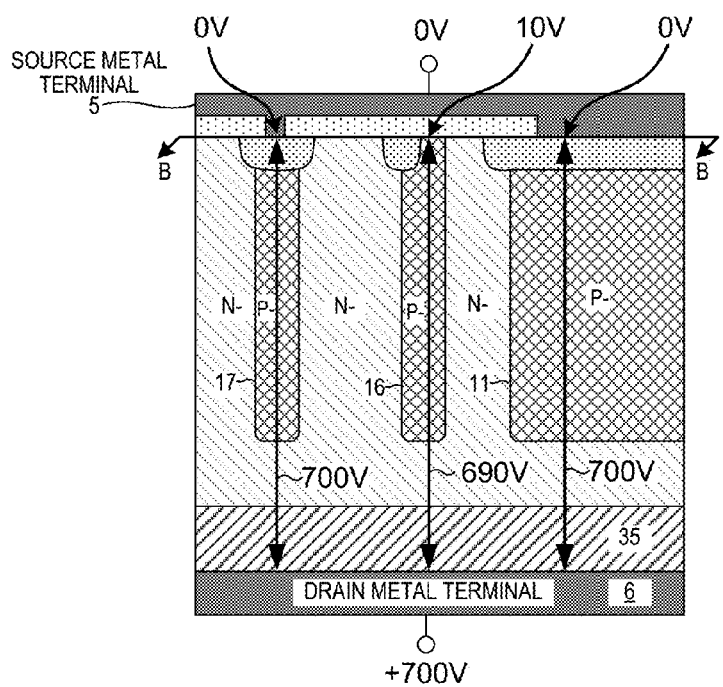
FIG. 10 is a diagram of the Super Junction FET device die 1 when a positive voltage of 700V is applied to the drain metal terminal 6 with respect to the source metal terminal 5.

FIG. 10 is a diagram of the Super Junction FET device die 1 when a positive voltage of 700V is applied to the drain metal terminal 6 with respect to the source metal terminal 5. Because the internal floating ring 16 is not electrically coupled to the source metal terminal 5, the upper portion of the internal floating ring 16 will float to a positive voltage greater than zero. The upper portion of the internal floating ring 16 will float to the positive voltage in part because of capacitive coupling effects between the floating ring 16 and the P− type columns 8-15 and 17 of the die 1. In this example, the upper portion of the internal floating ring 16 exhibits a 10V voltage with respect to the source metal terminal 5. As such, the voltage difference between the upper portion of the internal floating ring 16 and the drain metal terminal 6 will be approximately 690V. The strip-shaped P− type column 11 and the ring-shaped P− type column 17, on the other hand, contact the source metal 5. As such, the voltage difference between the upper portions of the strip-shaped P− type column 11 and the drain metal terminal 6 is approximately 700V, and the voltage difference between the ring-shaped P− type column 17 and the drain metal terminal 6 is approximately 700V. Therefore, the electric field is lower along a vertical extent of the internal floating ring 16. Because the electric field is lower along a vertical extent of the internal floating ring 16, the breakdown voltage will be higher along the vertical extent of the internal floating ring 16 than along a vertical extent of the strip-shaped P− type column 11 or ring-shaped P− type column 17. Consequently, the effects of any process variations during fabrication that would have yielded a greater electric field and lower breakdown voltage along the edges of the strip-shaped P− type column 11 are minimized due to the higher breakdown voltage along the internal floating ring 16.

Figure 11:
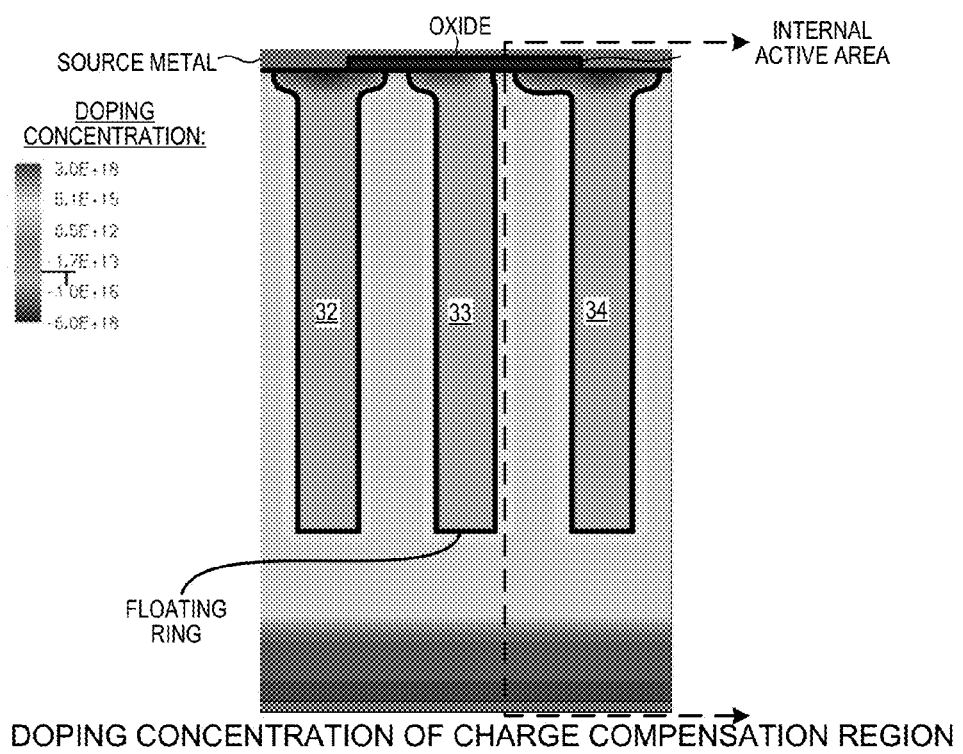
FIG. 11 is a diagram showing doping concentrations of the charge compensation region.

FIG. 11 is a diagram showing doping concentrations of a charge compensation region of a Super Junction FET. A portion of an upper surface of P− type pillar 32 contacts a source metal and a portion of an upper surface of P− type pillar 34 also contacts the source metal. No portion of an upper surface of P− type pillar 33 contacts the source metal. P− type pillar 33 is equivalent to the internal floating P− type pillar 16. The doping concentrations shown in FIG. 11 are one example of the N-type and P-type dopant concentrations of N− type material and P− type material that form the charge compensation region of a Super Junction FET device. In other embodiments, other doping concentrations known in the art are employed to form the charge compensation region, the un-trenched region, and the substrate.

Figure 12:
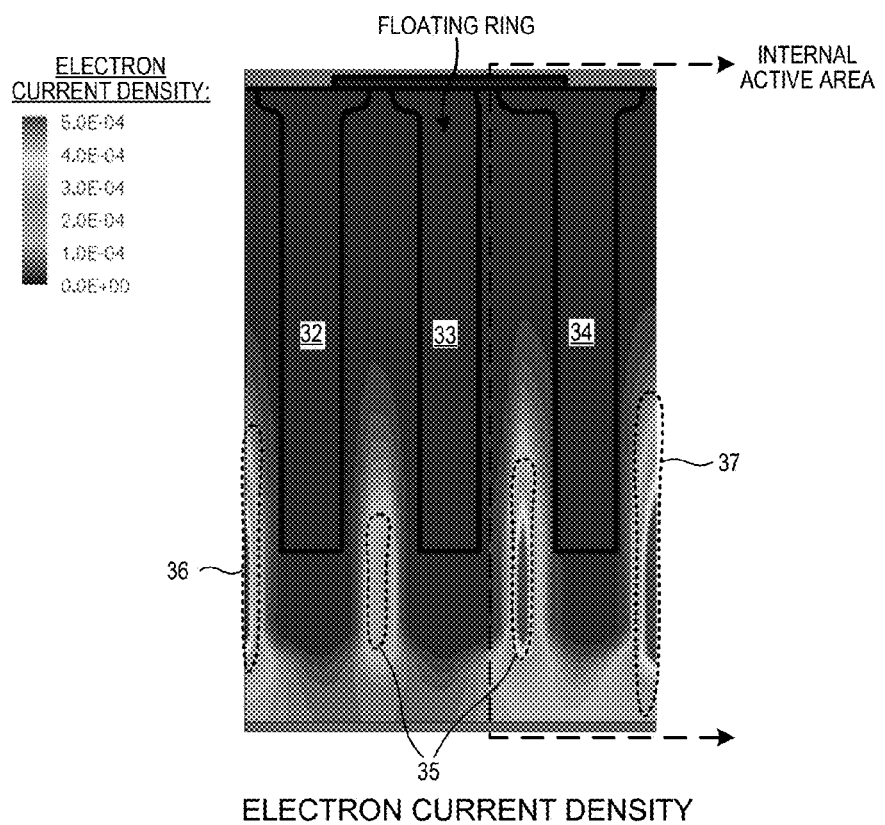
FIG. 12 is a diagram showing electron current density within the device when the device is undergoing avalanche breakdown.

FIG. 12 is a diagram showing electron current density within the device when the device is undergoing avalanche breakdown. At high voltage avalanche breakdown, electrons and holes are highly accelerated due to a high electric field. High energy charged particles impact atoms and remove electrons thereby generating holes or absences of electrons.

Electrons move down towards the positive biased drain electrode. Therefore, higher impact ionization yields higher electron current density.

Reference numeral 35 identifies two regions that are adjacent to the floating P− type column 33. Reference numeral 36 identifies a region that is adjacent to the P− type column 32. Reference numeral 37 identifies a region that is adjacent to the P− type column 34. Regions 36 and 37 are not adjacent to or nearby the floating P− type column 33. As such, regions 36 and 37 exhibit a significantly greater electron current density than regions 35 that are adjacent to the floating P− type column 33 during avalanche breakdown of the Super Junction FET. Regions 35 exhibit a lower electron current density because the oxide layer is disposed between the upper surface of the floating P− type column 33 and the source metal such that the floating P− type column 33 does not electrically contact the source metal. Under avalanche breakdown, no regions adjacent to the floating P− type column 33 will exhibit a maximum electron current density as compared to other regions of the Super Junction FET. Instead, the maximum electron current density will occur within the internal active area. When the novel floating P− type column 33 is employed, the floating P− type column 33 causes the Super Junction FET to have a breakdown voltage that is greater than 0.2% than when the P− type column 33 is coupled to the source metal.

Figure 13:
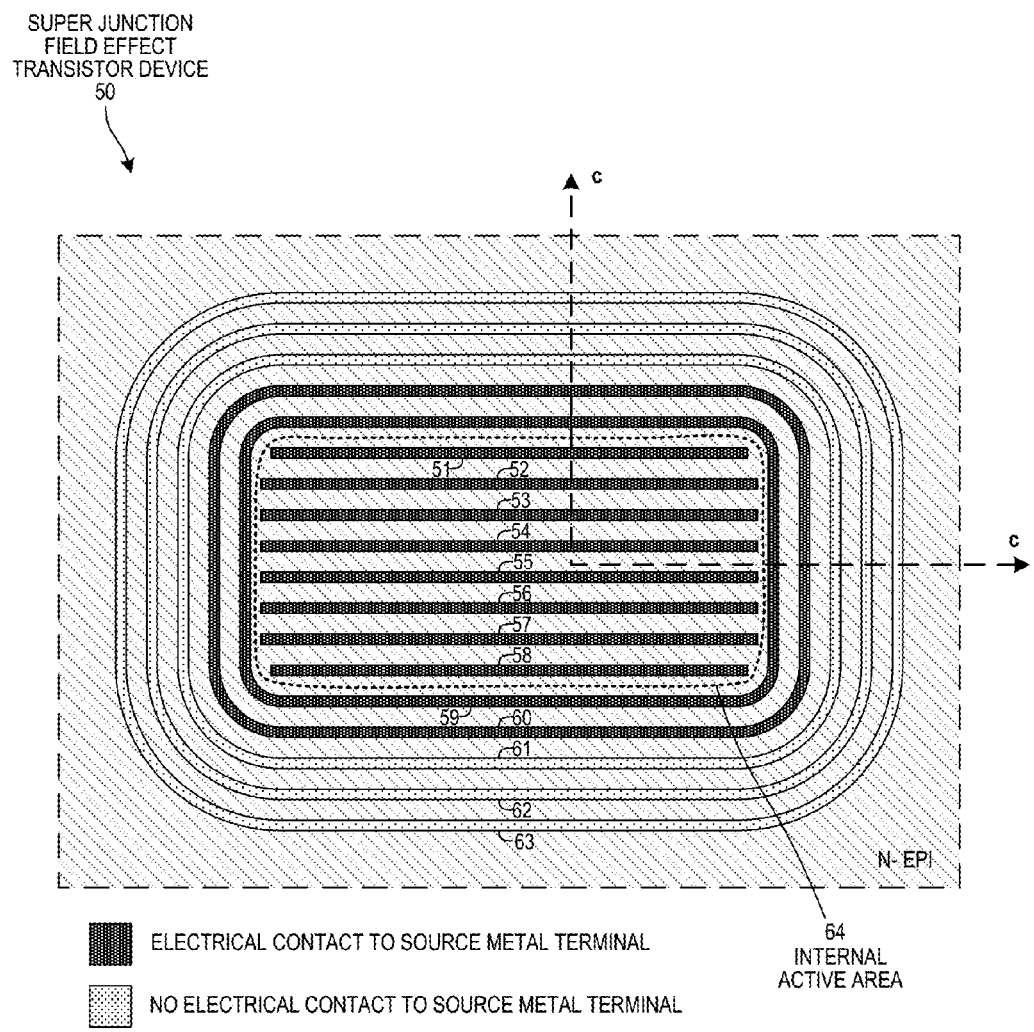
FIG. 13 is a top-down diagram of P– type columns 51-63 of a Super Junction FET device die 50.

FIG. 13 is a top-down diagram of P− type columns 51-63 of a Super Junction FET device die 50. The Super Junction FET device die 50 of FIG. 12 does not have any internal floating ring 16. The die 50 includes a set of strip-shaped P− type columns 51-58 and a set of ring-shaped P− type columns 59-63. An internal active area 64 includes strip-shaped P− type columns 51-58. An external active area includes ring-shaped columns 59 and 60. All of the P− type columns 51-60 of the internal and external active area contact a source metal terminal of the die 50.

Figure 14:
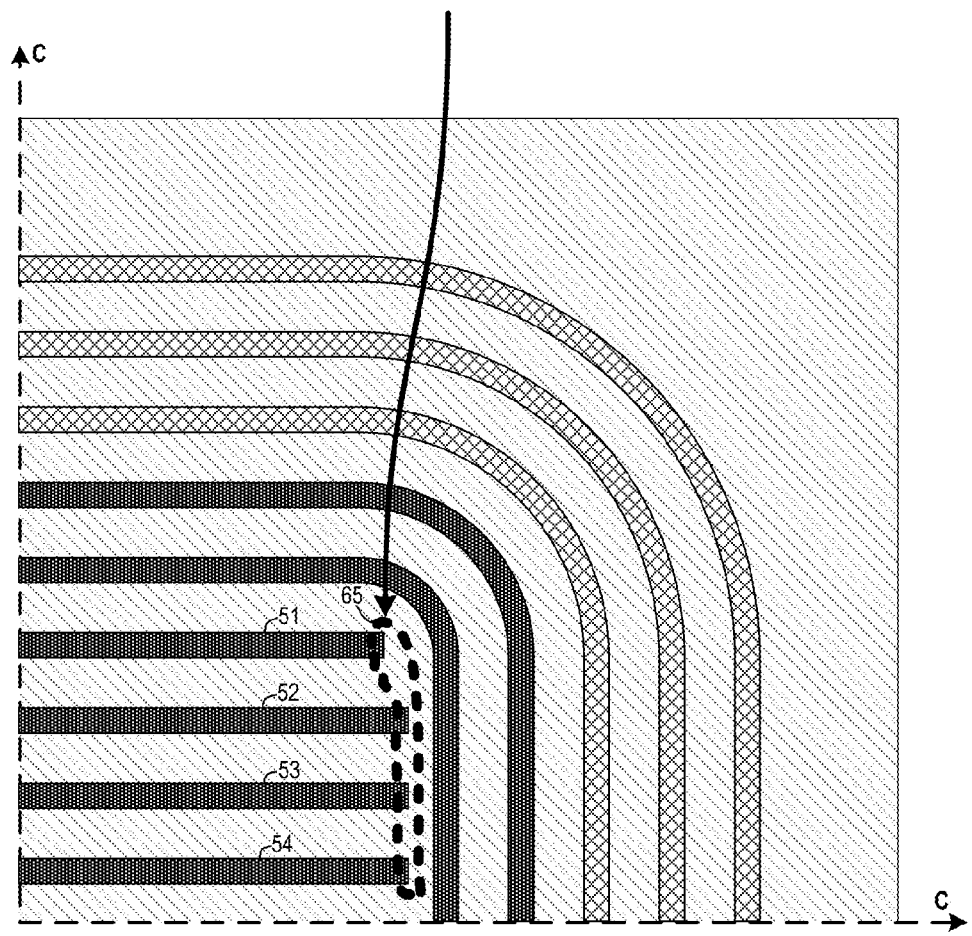
FIG. 14 is a diagram of an enlarged cross section C-C of the top-down diagram of P– type columns 51-63 of FIG. 13.

FIG. 14 is a diagram of an enlarged cross section C-C of the top-down diagram of P− type columns 51-63 of FIG. 13. Reference numeral 65 identifies corners and edges of the strip-shaped P− type columns 51-54 where the breakdown voltage has a high likelihood of being affected if charge imbalance occurs due to process variations during fabrication.

Figures 15, 16:
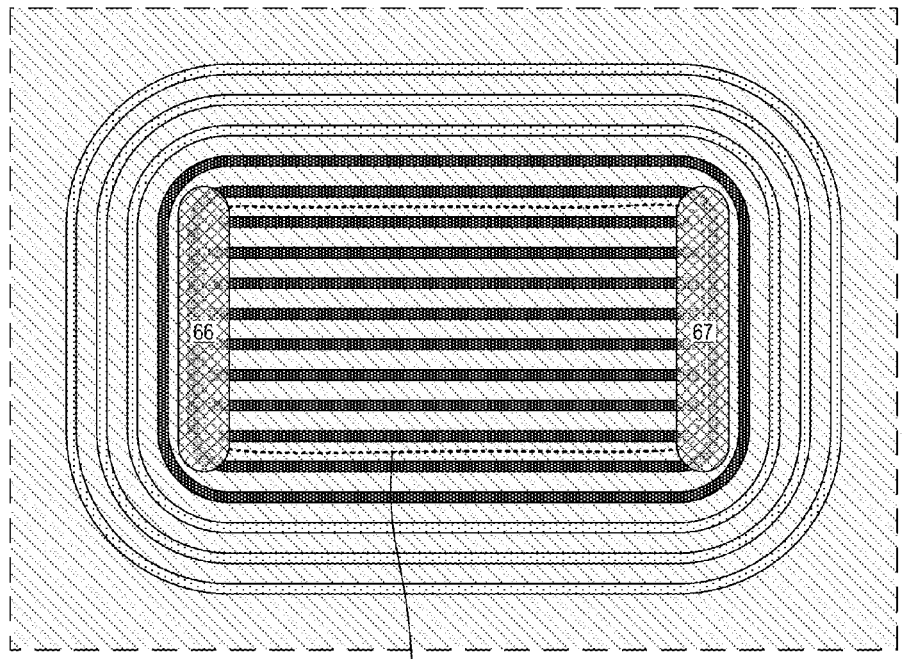
FIG. 15 is a top-down diagram of P– type columns 51-63 of die 50 identifying where the device 50 is most susceptible to failure.
FIG. 16 is a table showing the advantages exhibited by fabricating the Super Junction FET device die 1 with the internal floating ring 16 as compared to the Super Junction FET device die 50 of FIG. 13.

FIG. 15 is a top-down diagram of P− type columns 51-63 of die 50 identifying where the device 50 is most susceptible to failure. Reference numerals 66 and 67 identify corners and edges of the internal active area of the die 50. Any charge imbalance near the corners identified by reference numerals 66 and 67 will likely result in a greater electric field and a lower breakdown voltage along the corner and edge regions of the die 50, than near the center of the internal active area 64 of the die 50.

FIG. 16 is a table showing the advantages exhibited by the fabricating the Super Junction FET device die 1 with the internal floating ring 16. The Super Junction FET device die 1 with the internal floating ring 16 is less susceptible to process variations during fabrication than the die 50 that does not have an internal floating ring. Fabricating dice with the internal floating ring 16 will produce a higher yield than fabricating dice without the internal floating ring.

Figure 17:
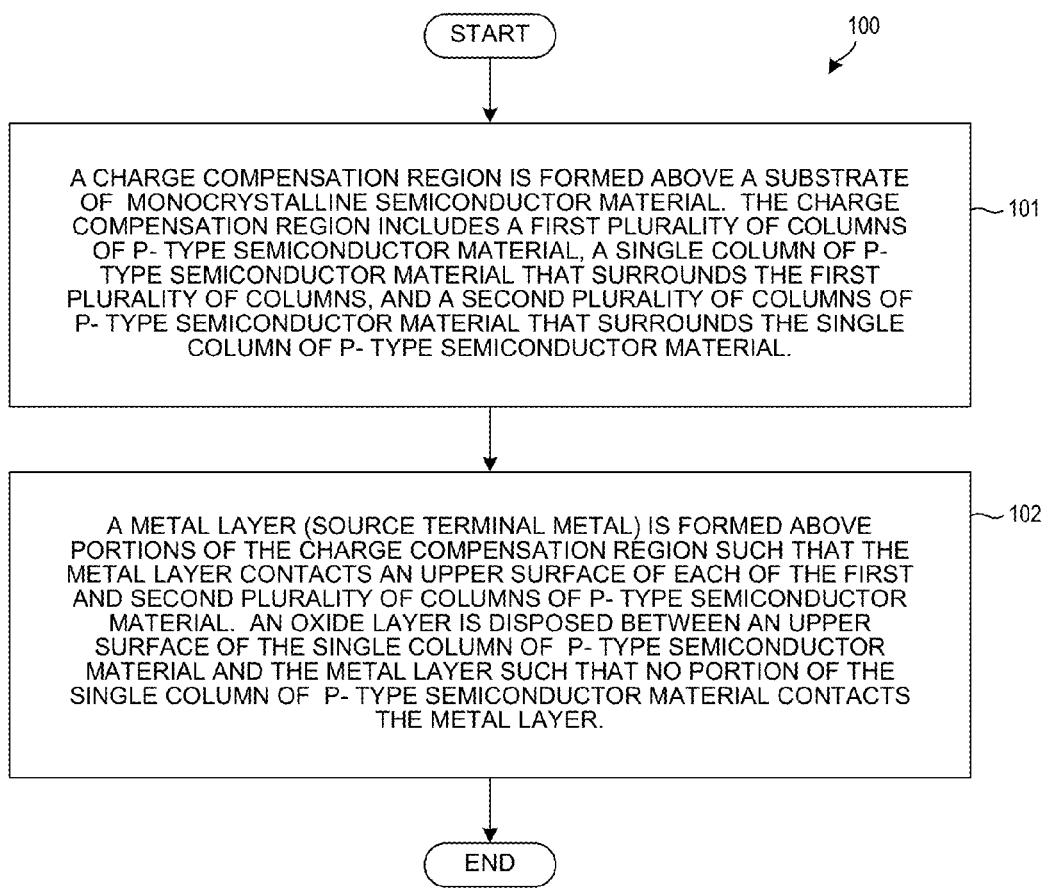
FIG. 17 is a flowchart of a method 100 in accordance with one novel aspect.

FIG. 17 is a flowchart of a method 100 in accordance with one novel aspect. In a first step (step 101), a charge compensation region is formed above a substrate of monocrystalline semiconductor material. The charge compensation region includes a first plurality of columns of P− type semiconductor material, a single column of P− type semiconductor material that surrounds the first plurality of columns, and a second plurality of columns of P− type semiconductor material that surrounds the single column of P− type semiconductor material. Each of the columns of P− type semiconductor material are formed within a region of N− type semiconductor material. For example, in FIG. 2, a first plurality of P− type columns 8-15 is formed within the N− epi region 22, a single P− type column 16 is formed within the N− epi region 22, and a second plurality of P− type columns 17 and 18 is formed within the N− epi region 22. The single P− type column 16 surrounds the first plurality of P− type columns 8-15. The second plurality of P− type columns 17 and 18 surround the single P− type column 16.

In a second step (step 102), a metal layer is formed above portions of the charge compensation region. The metal layer is formed such that the metal layer contacts an upper surface of each of the first and second plurality of columns of P− type semiconductor material. No portion of the single column of P− type semiconductor material contacts the metal layer and an oxide layer is disposed between an upper surface of the single column of P− type semiconductor material and the metal layer. For example, in FIG. 8, part of an upper surface of the P− type column 17 contacts the source metal terminal 5 and part of an upper surface of the P− type column 11 contacts the source metal terminal 5. An oxide layer 38 is disposed between an upper surface of P− type column 16 and the source metal terminal 5. No portion of the P− type column 16 contacts the source metal terminal 5. The P− type column 16 is electrically isolated from the source metal terminal 5.

Although the present invention has been described in connection with certain specific embodiments for instructional purposes, the present invention is not limited thereto. Although one way to make a charge compensation region is outlined above, any suitable one of many different charge compensation regions and techniques for making charge compensation regions, as are known in the art, can be employed. The novel Super Junction Field Effect Transistor can be fabricated using charge compensation regions manufactured and structured as described in U.S. patent application Ser. No. 12/234,549, entitled "SuperJunction Structures For Power Devices and Methods of Manufacture", filed Sep. 19, 2008, by Lee et al. (the subject matter of which is incorporated herein by reference). For additional background information on semiconductor manufacturing processes usable to make power field effect transistors, see: U.S. patent application Ser. No. 13/113,797, entitled "Vertical Power MOSFET and IGBT Fabrication Process With Two Fewer Photomasks," filed May 23, 2011, by Kyoung Wook Seok; U.S. patent application Ser. No. 13/413,715, entitled "Power Transistor With Increased Avalanche Current and Energy Rating," filed Mar. 7, 2012, by Kyoung Wook Seok; and U.S. patent application Ser. No. 14/231,516, entitled "Super Junction Field Effect Transistor," filed Mar. 31, 2014, by Kyoung Wook Seok (the subject matter of these three patent applications is incorporated herein by reference). Accordingly, various modifications, adaptations, and combinations of various features of the described embodiments can be practiced without departing from the scope of the invention as set forth in the claims.

What is claimed is:

1. A Super Junction Field Effect Transistor (FET) device, comprising:
   a substrate;
   a charge compensation region disposed above the substrate, wherein the charge compensation region comprises:

a first plurality of columns of P– type semiconductor material within a region of N– type semiconductor material, wherein each of the first plurality of columns of P– type semiconductor material includes a P– type body portion that extends from an upper portion of the column towards the substrate;

a floating ring that surrounds the first plurality of columns of P– type semiconductor material, wherein the floating ring is a ring-shaped column of P– type semiconductor material within the region of N– type semiconductor material; and a second plurality of columns of P– type semiconductor material within the region of N– type semiconductor material, wherein each of the second plurality of columns of P– type semiconductor material includes a P– type body portion that extends from an upper portion of the P– type column towards the substrate, and wherein the second plurality of columns of P– type semiconductor material surrounds the floating ring;

a layer of oxide disposed above portions of the charge compensation region, wherein the layer of oxide is disposed above an upper surface of the floating ring; and a source metal terminal disposed above portions of the charge compensation region, wherein the source metal terminal contacts each P– type body portion of the first plurality of columns of P– type semiconductor material, wherein the layer of oxide is disposed between the upper surface of the floating ring and the source metal terminal, and wherein the source metal terminal contacts each P– type body portion of the second plurality of columns of P– type semiconductor material.

2. The Super Junction FET device of claim 1, and wherein no portion of the floating ring contacts the source metal terminal.

3. The Super Junction FET device of claim 1, wherein the oxide layer that is disposed between the upper surface of the floating ring and the source metal terminal entirely covers the upper surface of the floating ring.

4. The Super Junction FET device of claim 3, wherein the oxide layer contacts the P– type semiconductor material of the floating ring, wherein the floating ring includes a P– type body portion that extends from an upper portion of the column towards the substrate, wherein the oxide layer also contacts an upper surface of the P– type body portion, and wherein the oxide layer electrically isolates the floating ring from the source metal terminal.

5. The Super Junction FET device of claim 1, wherein the first plurality of columns of P– type semiconductor material is arranged in strips that extend in a direction parallel to an edge of the Super Junction FET device.

6. The Super Junction FET device of claim 1, wherein the second plurality of columns of P– type semiconductor material is a concentric set of ring-shaped columns that surrounds the floating ring.

7. The Super Junction FET device of claim 1, wherein the first plurality of columns of P– type semiconductor material, the floating ring, and the second plurality of columns of P– type semiconductor material are parts of an active area of the Super Junction FET device.

8. A Super Junction Field Effect Transistor (FET) device, comprising:

a plurality of columns of P– type semiconductor material within a region of N– type semiconductor material disposed above a substrate, wherein an upper portion of the columns of P– type semiconductor material contacts a source metal of the device; and means for increasing a breakdown voltage of the Super Junction FET device, wherein the means surrounds the plurality of columns of P– type semiconductor material, wherein an oxide is disposed between the means and the source metal of the device, and wherein the means is surrounded by a plurality of ring-shaped columns of P– type semiconductor material that contacts the source metal.

9. The Super Junction FET device of claim 8, wherein the means is a ring-shaped column of P– type semiconductor material within the region of N– type semiconductor material, wherein the ring-shaped column of P– type semiconductor material surrounds the plurality of columns of P– type semiconductor material, and wherein the ring-shaped column of P– type semiconductor is electrically isolated from the source metal of the device.

10. The Super Junction FET device of claim 8, wherein the Super Junction FET device exhibits a first breakdown voltage when an upper surface of the means does not contact the source metal of the device, wherein the Super Junction FET device exhibits a second breakdown voltage when the upper surface of the means contacts the source metal of the device, and wherein the first breakdown voltage is 0.2% greater than the second breakdown voltage.

11. The Super Junction FET device of claim 8, wherein each of the plurality of columns of P– type semiconductor material has a shape taken from the group consisting of: a pillar shape, a stripe shape, and a ring shape.

12. The Super Junction FET device of claim 8, wherein the plurality of ring-shaped columns of P– type semiconductor material surrounds the means and is disposed within the region of N– type semiconductor material.

* * * * *